United States Patent
Wang

(10) Patent No.: US 12,230,553 B2
(45) Date of Patent: Feb. 18, 2025

(54) SEMICONDUCTOR STRUCTURE, MANUFACTURING METHOD OF SEMICONDUCTOR STRUCTURE AND STACKED STRUCTURE

(71) Applicant: CHANGXIN MEMORY TECHNOLOGIES, INC., Hefei (CN)

(72) Inventor: Luguang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 469 days.

(21) Appl. No.: 17/647,458

(22) Filed: Jan. 8, 2022

(65) Prior Publication Data
US 2022/0319958 A1    Oct. 6, 2022

Related U.S. Application Data

(63) Continuation of application No. PCT/CN2021/112066, filed on Aug. 11, 2021.

(30) Foreign Application Priority Data

Apr. 1, 2021    (CN) .................. 202110357894.X

(51) Int. Cl.
  *H01L 23/48*    (2006.01)
  *H01L 21/768*    (2006.01)

(52) U.S. Cl.
  CPC ...... *H01L 23/481* (2013.01); *H01L 21/76898* (2013.01)

(58) Field of Classification Search
  CPC .............. H01L 23/481; H01L 21/76898; H01L 21/7682
  See application file for complete search history.

(56) References Cited

U.S. PATENT DOCUMENTS

2012/0056330 A1    3/2012  Lee et al.
2012/0248624 A1    10/2012 Endo
(Continued)

FOREIGN PATENT DOCUMENTS

CN    101355069 A    1/2009
CN    105826279 A    8/2016

OTHER PUBLICATIONS

International Search Report in Application No. PCT/CN2021/112066, mailed on Jan. 6, 2022.
(Continued)

*Primary Examiner* — Herve-Louis Y Assouman
(74) *Attorney, Agent, or Firm* — Syncoda LLC; Feng Ma

(57) ABSTRACT

Disclosed are a semiconductor structure and a manufacturing method thereof. The semiconductor structure includes: a base, including a substrate and a dielectric layer, where the substrate includes a front surface and a back surface that are opposite to each other; the dielectric layer is formed on the front surface; the base is provided with a via hole; the via hole penetrates the substrate from the back surface of the substrate and extends to the dielectric layer; an insulating layer, located on an inner wall surface of the via hole; and a conductive structure, where the conductive structure includes a first conductive layer and a second conductive layer connected to each other; the first conductive layer is close to a bottom of the via hole, and the second conductive layer is close to a top of the via hole.

14 Claims, 6 Drawing Sheets

(56) References Cited

U.S. PATENT DOCUMENTS

| | | | |
|---|---|---|---|
| 2013/0134548 A1* | 5/2013 | Torii | H01L 23/481 |
| | | | 257/508 |
| 2014/0306351 A1* | 10/2014 | Kim | H01L 21/76831 |
| | | | 438/653 |
| 2016/0358821 A1* | 12/2016 | Chen | H01L 21/76898 |

OTHER PUBLICATIONS

CN first search report in Application No. 202110357894X, mailed on Apr. 12, 2023.

* cited by examiner

SEMICONDUCTOR STRUCTURE, MANUFACTURING METHOD OF SEMICONDUCTOR STRUCTURE AND STACKED STRUCTURE

CROSS-REFERENCE TO RELATED APPLICATIONS

The present disclosure is a continuation of International Application No. PCT/CN2021/112066 filed on Aug. 11, 2021, which claims priority to Chinese Patent Application No. 202110357894.X filed on Apr. 1, 2021. The disclosures of the above-referenced applications are incorporated herein by reference in their entirety.

TECHNICAL FIELD

The present disclosure relates to the technical field of integrated circuits (ICs), and in particular to a semiconductor structure, a manufacturing method of the semiconductor structure and a stacked structure.

BACKGROUND

Through silicon via (TSV) technology enables the stacking of chips in three-dimensional (3D) integrated circuits (ICs) to achieve interconnection, thereby fabricating more complex, more powerful and more cost-effective electronic devices. It has become the most remarkable electronic packaging technology.

TSV structures typically include metal conductive structures. The conductive structures are typically annealed after being formed so as to make their size more uniform. However, annealing will cause thermal expansion of the conductive structures. As a result, structures surrounding the conductive structures, for example, the semiconductor substrate and the dielectric layer thereon, may be prone to interface cracks due to thermal stress, thereby affecting the performance of the structures surrounding the conductive structures.

SUMMARY

Some embodiments of the present disclosure provide a semiconductor structure, a manufacturing method of the semiconductor structure and a stacked structure.

A semiconductor structure includes:

a base, including a substrate and a dielectric layer, where the substrate includes a front surface and a back surface that are opposite to each other; the dielectric layer is formed on the front surface; the base is provided with a via hole; and the via hole penetrates the substrate from the back surface of the substrate and extends to the dielectric layer;

an insulating layer located on an inner wall surface of the via hole; and a conductive structure, where the conductive structure includes a first conductive layer and a second conductive layer connected to each other; the first conductive layer is close to a bottom of the via hole, and the second conductive layer is close to a top of the via hole; and a diameter of the first conductive layer is less than that of the second conductive layer.

A manufacturing method of a semiconductor structure includes:

providing a base, where the base includes a substrate and a dielectric layer; the substrate includes a front surface and a back surface that are opposite to each other; the dielectric layer is formed on the front surface; the base is provided with a via hole; and the via hole penetrates the substrate from the back surface of the substrate and extends to the dielectric layer;

forming an insulating layer on an inner wall surface of the via hole; and forming a conductive structure on a surface of the insulating layer, where the conductive structure includes a first conductive layer and a second conductive layer connected to each other; the first conductive layer is close to a bottom of the via hole, and the second conductive layer is close to a top of the via hole; and a diameter of the first conductive layer is less than that of the second conductive layer.

A stacked structure is formed by processing the above-mentioned semiconductor structure.

The above description is merely an overview of the technical solution of the present disclosure. To make the technical means of the present disclosure more comprehensible and implemented in accordance with the content of the specification, the present disclosure is described in detail below with reference to the preferred embodiments and drawings of the present disclosure.

BRIEF DESCRIPTION OF THE DRAWINGS

To describe the technical solutions in the embodiments of the present disclosure or in the prior art more clearly, the drawings required for describing the embodiments or the prior art are described briefly below. Apparently, the drawings in the following description merely show some embodiments of the present disclosure, and those of ordinary skill in the art may still derive other drawings from these drawings without creative efforts.

DETAILED DESCRIPTION

Figure 1:
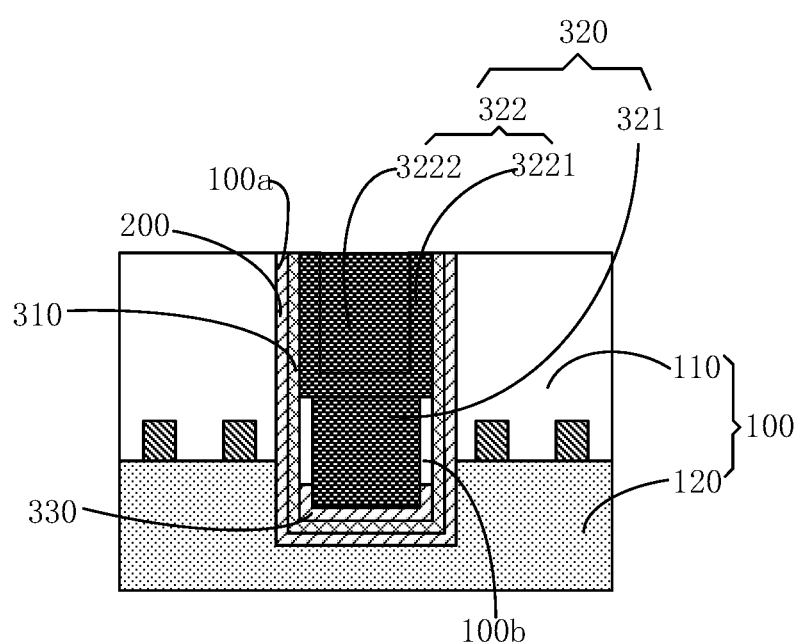
FIG. 1 is a view illustrating a semiconductor structure according to an embodiment of the present disclosure.

In order to facilitate the understanding of the present disclosure, the present disclosure is described more comprehensively below with reference to the drawings. The embodiments of the present disclosure are shown in the drawings. However, the present disclosure may be embodied in various forms without being limited to the embodiments described herein. These embodiments are provided in order to make the present disclosure more thorough and comprehensive.

Unless otherwise defined, all technical and scientific terms used herein have the same meaning as commonly understood by those skilled in the technical field of the present disclosure. The terms mentioned herein are merely for the purpose of describing specific embodiments, rather than to limit the present disclosure.

It should be understood that when an element or layer is "on", "adjacent to", "connected to" or "coupled to" other element or layer, it may be on, adjacent to, connected to or coupled to other element or layer directly or indirectly via an intermediate element or layer. When an element is "directly on", "directly adjacent to", "directly connected to" or "directly coupled to" other element or layer, there is no intermediate element or layer. It should be understood that although the terms such as "first", "second" and "third" may be used to describe various elements, components, regions, layers, doping types and/or portions, these elements, components, regions, layers, doping types and/or portions should not be limited by these terms. These terms are only used to distinguish one element, component, region, layer, doping type or portion from another element, component, region, layer, doping type or portion. Therefore, a first element, component, region, layer, doping type or portion described may be expressed as a second element, component, region, layer or portion without departing from the concept of the present disclosure.

Terms such as "under", "below", "underneath", "beneath", "above" and "on" are intended to describe the spatial relationship between one element or feature and other element or feature shown in the drawings. It should be understood that these terms are also intended to indicate different orientations of devices in use and operation in addition to the orientations shown in the drawings. For example, if the device in the drawing is flipped, an element or feature described as "under", "underneath" or "below" other element will be oriented "on" the other element or feature. Therefore, the exemplary terms "under" and "below" may include the orientations of "above" and "below". In addition, the device may also include other orientations (for example, 90° rotation or other orientations), and the terms used herein should be explained accordingly.

In this specification, the singular forms of "a", "an" and "the/this" may also include plural forms, unless clearly indicated otherwise. It should also be understood that the terms such as "including/comprising" and "having" indicate the existence of the stated features, wholes, steps, operations, components, parts or combinations thereof. However, these terms do not exclude the possibility of the existence of one or more other features, wholes, steps, operations, components, parts or combinations thereof. Meanwhile, in this specification, the term "and/or" includes any and all combinations of related listed items.

The embodiments of the present disclosure are described herein with reference to schematic diagrams or cross-sectional views of ideal embodiments (and intermediate structures) of the present disclosure, in anticipation of changes in the illustrated shape due to, for example, manufacturing technology and/or tolerances. Therefore, the embodiments of the present disclosure should not be limited to the specific shape shown here, but include shape deviations due to, for example, manufacturing technology.

Referring to FIG. 1, an embodiment of the present disclosure provides a semiconductor structure. The semiconductor structure includes a base 100, an insulating layer 200 and a conductive structure 320.

The base 100 includes a substrate 110 and a dielectric layer 120. The substrate 110 includes a front surface 110a and a back surface 110b that are opposite to each other. The dielectric layer 120 is formed on the front surface 110a. The base 100 is provided with a via hole 100a. The via hole 100a penetrates the substrate 110 from the back surface 110b of the substrate 100 and extends to the dielectric layer 120. The insulating layer 200 is located on an inner wall surface of the via hole 100a. The conductive structure 320 includes a first conductive layer 321 and a second conductive layer 322 connected to each other. The first conductive layer 321 is close to a bottom of the via hole 100a, and the second conductive layer 322 is close to a top of the via hole 100a. A diameter of the first conductive layer 321 is less than that of the second conductive layer 322.

In this embodiment, the diameter of the first conductive layer 321 corresponding to a semiconductor device formed between the substrate 110 and the dielectric layer 120 is small. Therefore, the expansion stress of the first conductive layer 321 on the substrate 110 and the dielectric layer 120 in this corresponding part is small, thereby reducing the thermal stress of the conductive structure 320 on the surrounding device.

In an embodiment, the semiconductor structure further includes a barrier layer 310. The barrier layer 310 is located on a surface of the insulating layer 200, and there is a gap 100b between the barrier layer 310 and the first conductive layer 321. The gap 100b may be filled with air or other heat insulating medium. The barrier layer 310 is a film layer that effectively inhibits the thermal expansion stress of the conductive structure 320. The barrier layer 310 may be made of tantalum (Ta), tantalum nitride (TaN), etc., and may have a thickness of 0.05-0.1 µm. The barrier layer 310 can effectively reduce the thermal expansion coefficient of the conductive structure 320 when the conductive structure 320 is thermally expanded.

Since the air in the gap 100b has poor thermal conductivity, the heat generated by the conductive structure 320 can be further prevented from spreading to the surrounding device. Meanwhile, the gap 100b isolates the first conductive layer 321 from the barrier layer 310, thereby effectively blocking the thermal expansion stress of the first conductive layer, so as to better protect the surrounding device.

In an embodiment, the first conductive layer 321 and the barrier layer 310 are spaced apart, and the second conductive layer 322 is connected to the barrier layer 310. The first conductive layer 321 may be made of a metal conductive material such as copper (Cu). Specifically, the first conductive layer may include a first seed layer and a first conductive portion. The first seed layer is formed on a surface of the barrier layer 310, and the first conductive portion is formed on a surface of the first seed layer.

In an embodiment, the semiconductor structure further includes an isolation layer 330. The isolation layer 330 is located at the bottom of the via hole 100a and between the barrier layer 310 and the first conductive layer 321. The barrier layer 310, the isolation layer 330, the first conductive layer 321 and the second conductive layer 322 together enclose the gap 100b filled with air.

In an embodiment, the second conductive layer 322 includes a second seed layer 3221 and a second conductive portion 3222. The second seed layer 3221 surrounds the second conductive portion 3222. A sidewall of the second seed layer 3221 is in contact with the barrier layer 310, and the bottom of the second seed layer 3221 is in contact with the first conductive layer 321.

An embodiment further provides a stacked structure. The stacked structure is formed by processing the above-mentioned semiconductor structure.

Specifically, when the stacked structure is formed, the above-mentioned semiconductor structure is processed through a process such as etching or planarization, such that the conductive structure 320 in the dielectric layer 120 is exposed (not shown). In this way, when this semiconductor structure is stacked with an adjacent semiconductor structure, the conductive structure 320 in the via hole 100a can be conductively connected to achieve signal transmission.

Figure 2:
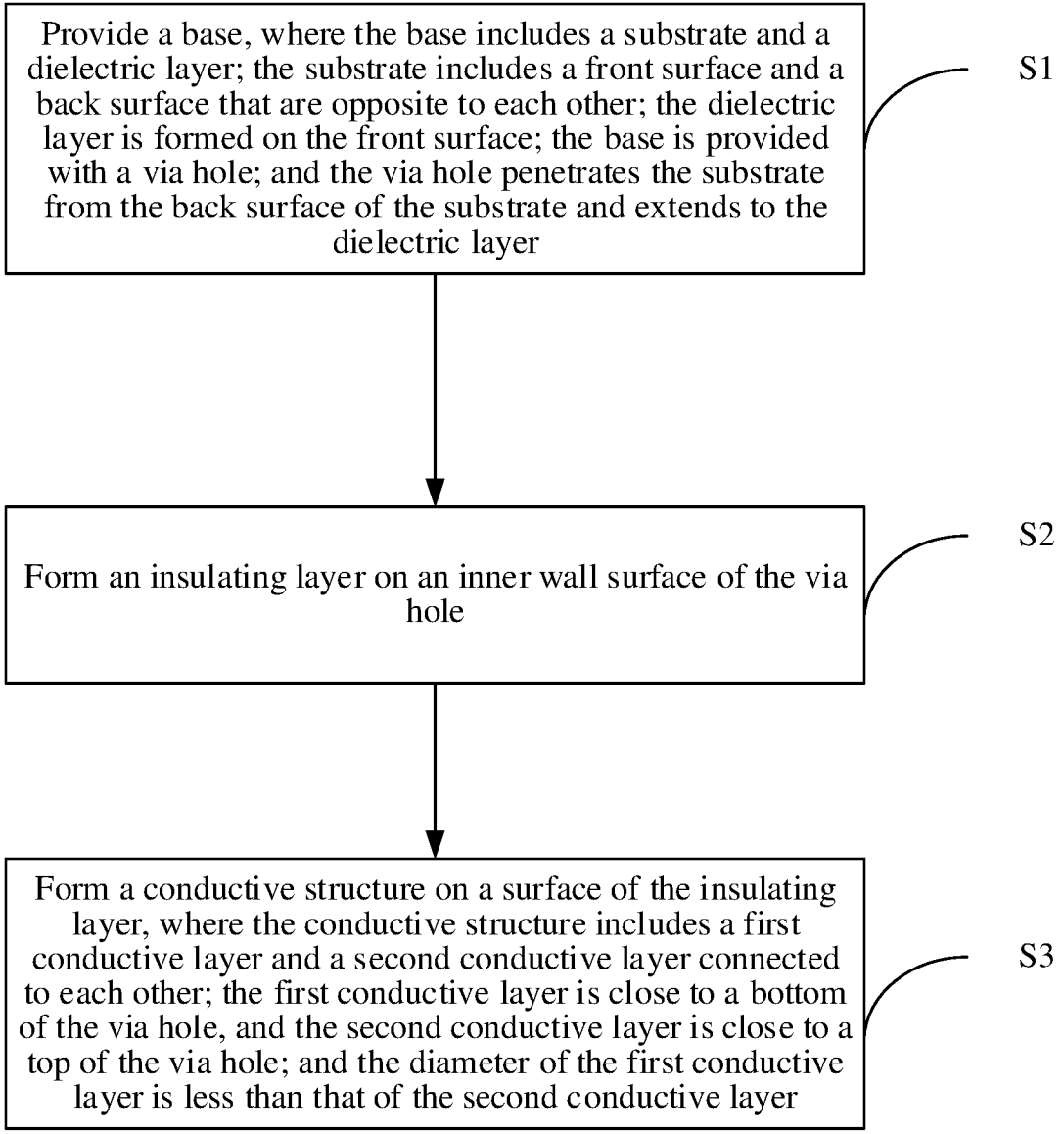
FIG. 2 is a flowchart of a manufacturing method of the semiconductor structure according to an embodiment of the present disclosure.

Referring to FIG. 2, an embodiment provides a manufacturing method of a semiconductor structure. The manufacturing method includes:

Step S1: Provide a base, where the base includes a substrate and a dielectric layer;

the substrate includes a front surface and a back surface that are opposite to each other;

the dielectric layer is formed on the front surface; the base is provided with a via hole;

and the via hole penetrates the substrate from the back surface of the substrate and extends to the dielectric layer.

Step S2: Form an insulating layer on an inner wall surface of the via hole.

Step S3: Form a conductive structure on a surface of the insulating layer, where the conductive structure includes a first conductive layer and a second conductive layer connected to each other; the first conductive layer is close to a bottom of the via hole, and the second conductive layer is close to a top of the via hole; and a diameter of the first conductive layer is less than that of the second conductive layer.

The manufacturing method of a semiconductor structure is described in detail below with references to FIGS. 1 and 3 to 11.

Step S100: Provide a base 100.

Figure 3:
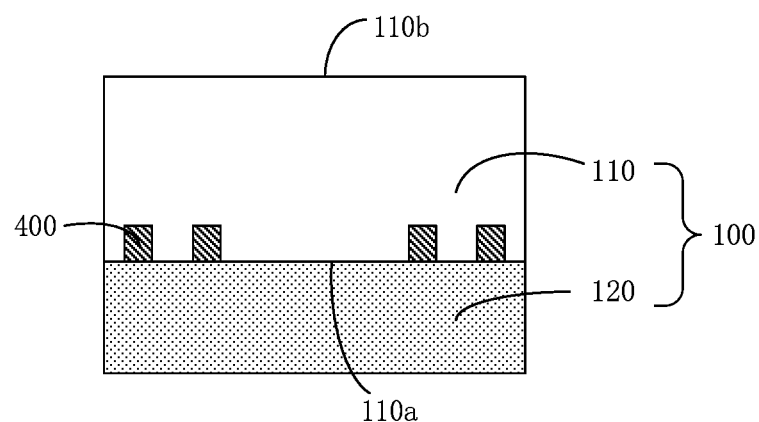
FIG. 3 is a view illustrating a structure obtained by implementing step S100 of the manufacturing method of the semiconductor structure shown in FIG. 1.

As shown in FIG. 3, the base 100 includes a substrate 110 and a dielectric layer 120. The substrate 110 has a front surface 110a and a back surface 110b that are opposite to each other. The dielectric layer 120 is formed on the front surface 110a.

In Step S100, the substrate 110 may include, but is not limited to, a silicon substrate. A shallow trench isolation structure 400 may be formed on a side of the substrate 110 close to the dielectric layer 120. The shallow trench isolation structure 400 isolates the substrate 110 into multiple active regions. The active regions are used to form various semiconductor devices.

The dielectric layer 120 may include, but is not limited to, a dielectric layer made of an oxide (such as silicon dioxide). A via structure and a metal layer electrically connecting the active regions may be formed in the dielectric layer 120, so as to draw out signals of the semiconductor devices to the outside or provide an external signal for the semiconductor devices.

Step S200: Form a via hole 100a in the base 100.

Figure 4:
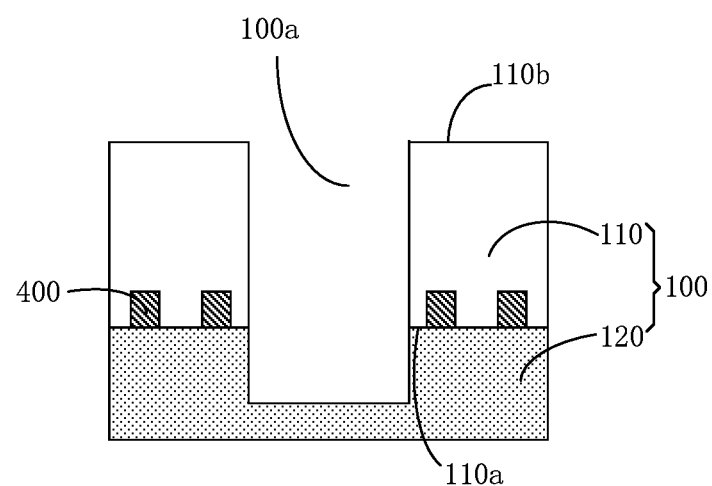
FIG. 4 is a view illustrating a structure obtained by implementing step S200 of the manufacturing method of the semiconductor structure shown in FIG. 1.

Referring to FIG. 4, specifically, the base 100 shown in FIG. 3 may be etched from the back surface 110b of the substrate 110 by dry etching, thereby forming the base 100 with the via hole 100a. The via hole 100a penetrates the substrate 110 from the back surface 110b of the substrate 110 and extends to the dielectric layer 120. The depth of the via hole 100a may be 20-150 μm, and the depth that the via hole extends into the dielectric layer 120 may be 0.5-1 μm. The diameter of the via hole 100a may be 3-50 μm. The depth-to-width ratio (that is, the ratio of the depth to the diameter) of the via hole 100a may be 0.4-50.

The via hole 100a is used to form a conductive structure therein. When chips formed by multiple semiconductor structures are stacked, the corresponding via holes 100a of the chips are aligned, such that the conductive structures in the via holes 100a are electrically connected, thereby realizing interconnection between the chips.

The back surface 110b of the substrate 110 is far away from the semiconductor devices formed in the active regions and circuit structures connecting the semiconductor devices. Therefore, in this embodiment, when the via hole 100a is formed, damage to the semiconductor devices formed in the active regions and the related circuit structures is effectively prevented.

Step S300: Form an insulating layer 200 on an inner wall surface of the via hole 100a.

Figure 5:
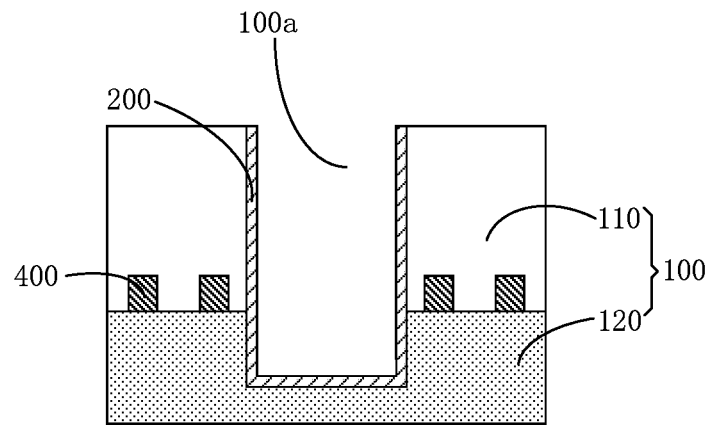
FIG. 5 is a view illustrating a structure obtained by implementing step S300 of the manufacturing method of the semiconductor structure shown in FIG. 1.

Referring to FIG. 5, the insulating layer 200 is used to achieve electrical isolation between the conductive structure and the substrate 110. The insulating layer 200 may be made of silicon dioxide, etc. The materials of the insulating layer 200 and the dielectric layer 120 may be the same or different.

When the insulating layer 200 is made of silicon dioxide, specifically, a silicon dioxide film layer may be deposited as the insulating layer 200 on an inner wall of the via hole 100a through chemical vapor deposition (CVD) based on silane ($SiH_4$) or tetraethyl orthosilicate (TEOS). The thickness of the silicon dioxide film layer may be 0.2-2 μm.

Step S400: Form a barrier layer 310 on a surface of the insulating layer 200.

Figure 6:
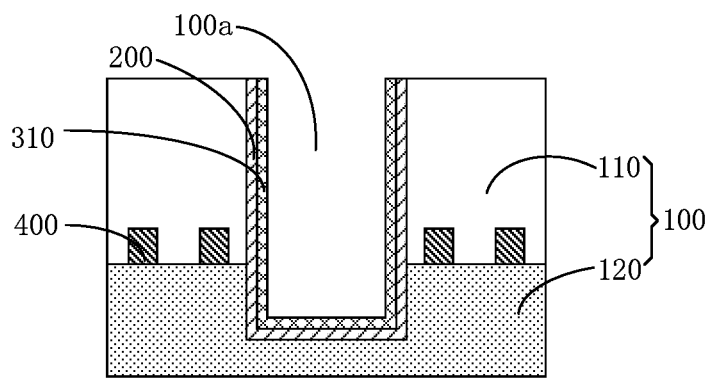
FIG. 6 is a view illustrating a structure obtained by implementing step S400 of the manufacturing method of the semiconductor structure shown in FIG. 1.

Referring to FIG. 6, the barrier layer 310 may be made of tantalum (Ta), tantalum nitride (TaN), etc., and may have a thickness of 0.05-0.1 μm.

Step S500: Form a primary isolation layer 331 on a surface of the barrier layer 310, where the primary isolation layer 331 includes a sidewall portion 3311.

Figure 7:
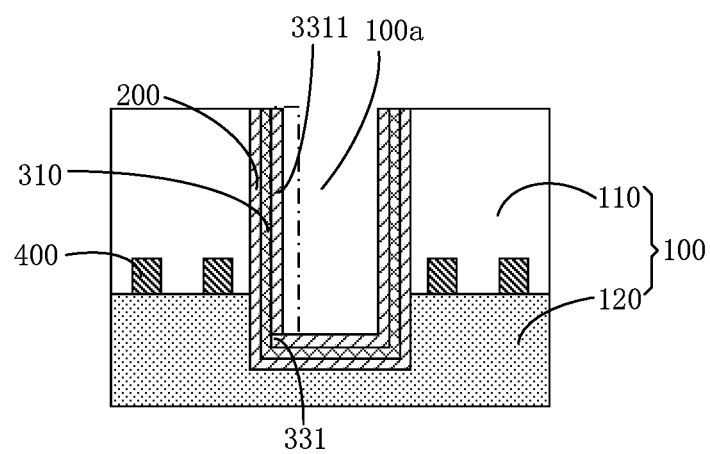
FIG. 7 is a view illustrating a structure obtained by implementing step S500 of the manufacturing method of the semiconductor structure shown in FIG. 1.

Referring to FIG. 7, the primary isolation layer 331 is made of an insulating material. As an example, the primary isolation layer 331 may be made of silicon dioxide. Specifically, a 0.2-2 μm thick silicon dioxide film layer may be deposited as the primary isolation layer 331 on the inner wall of the via hole 100a through CVD based on silane ($SiH_4$) or tetraethyl orthosilicate (TEOS).

Step S600: Form a primary conductive layer 3211 on a surface of the primary isolation layer 331.

Figure 8:
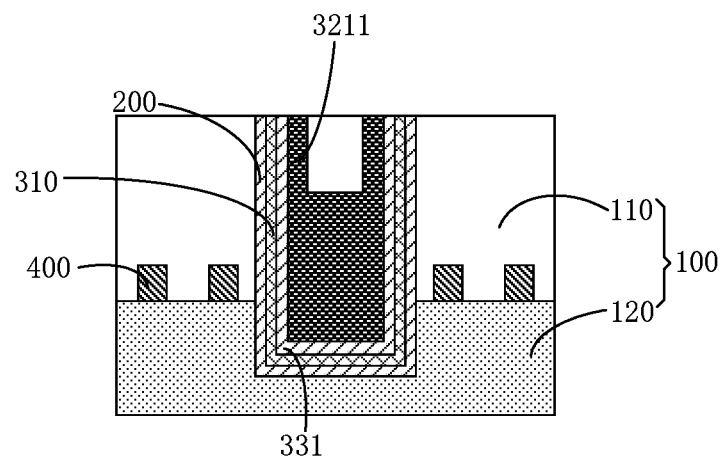
FIG. 8 is a view illustrating a structure obtained by implementing step S600 of the manufacturing method of the semiconductor structure shown in FIG. 1.

Referring to FIG. 8, specifically, a first primary seed layer may be formed on the surface of the barrier layer 310, and then a first primary conductive layer may be formed on a surface of the first primary seed layer. The first primary conductive layer and the first primary seed layer define the primary conductive layer 3211.

As an example, the primary conductive layer 3211 may be made of copper (Cu). In this case, a copper seed layer may be formed on the surface of the barrier layer 310 as the first primary seed layer through physical vapor deposition (PVD). Then, copper (Cu) is electroplated on a surface of the first primary seed layer to form the first primary conductive layer.

Since a part of the primary conductive layer 3211 is to be removed in a subsequent step S700 to form a gap 100b filled with air, the primary conductive layer 3211 grown on the surface of the barrier layer 310 may not fill the via hole 100a. As an example, the filling thickness of a central part of the primary conductive layer 3211 may be 20-70% of the depth of the via hole 100a.

Step S700: Remove a part of the primary conductive layer 3211 to expose a part of the sidewall portion 3311, such that the remaining primary conductive layer 3211 defines a first conductive layer 321.

Figure 9:
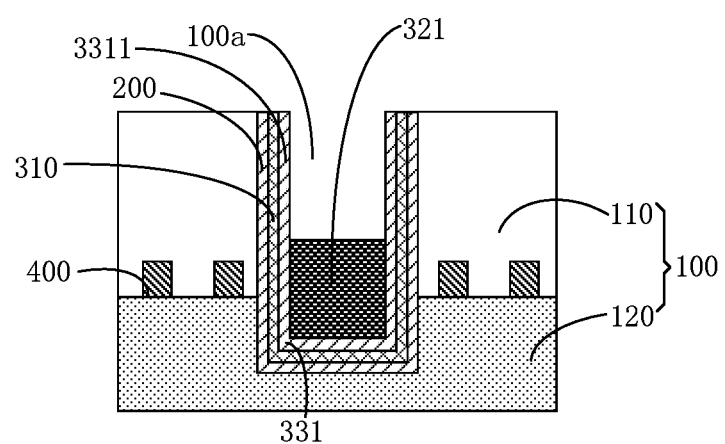
FIG. 9 is a view illustrating a structure obtained by implementing step S700 of the manufacturing method of the semiconductor structure shown in FIG. 1.

Referring to FIG. 9, a part of the primary conductive layer 3211 covering the sidewall portion 3311 may be removed by a mixed acid solution (for example, a mixed solution of $H_2SO_4/H_2O_2$), so as to expose a part of the sidewall portion 3311 of the primary isolation layer 331 and form the first conductive layer 321.

Specifically, in this case, the first primary seed layer forms a first seed layer, and the first primary conductive layer forms a first conductive portion. The first seed layer and the first conductive portion define the first conductive layer 321.

Step S800: Remove a part of the sidewall portion 3311 to form the gap 100b between the barrier layer 310 and the first conductive layer 321, where the remaining primary isolation layer 331 defines an isolation layer 330.

Figure 10:
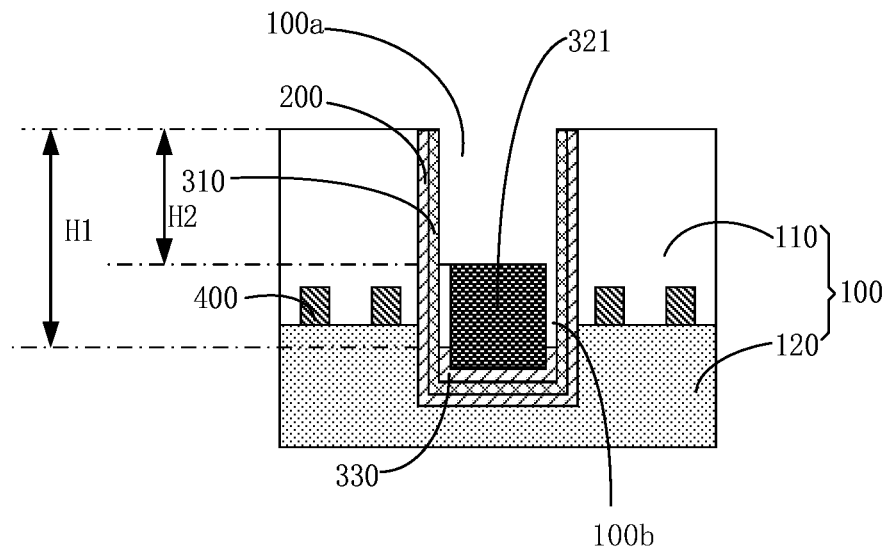
FIG. 10 is a view illustrating a structure obtained by implementing step S800 of the manufacturing method of the semiconductor structure shown in FIG. 1.

Referring to FIG. 10, specifically, the sidewall portion 3311 of the primary isolation layer 331 (such as a silicon dioxide film layer) may be etched by hydrofluoric acid or dry etching to form the gap 100b between the barrier layer 310 and the first conductive layer 321.

After a part of the primary isolation layer 331 is removed, a distance H1 between a surface of the isolation layer 330 formed by the remaining primary isolation layer 331 and an opening of the via hole 100a is greater than a distance H2 between a surface of the first conductive layer 321 and the opening of the via hole 100a. That is, after this part of the primary isolation layer 331 is removed, an upper surface of the isolation layer 330 formed by the remaining primary isolation layer 331 is lower than that of the first conductive layer 321.

In this embodiment, by forming the isolation layer 330, the first conductive layer 321 and the barrier layer 310 are spaced apart easily and effectively. Of course, in other embodiments, the isolation layer 330 may not be formed. Instead, the first conductive layer 321 and the barrier layer 310 may be spaced apart by other means, which is not limited herein.

Step S900: Form a second seed layer 3221 on the surface of the barrier layer 310 and the surface of the first conductive layer 321, where the second seed layer 3221 closes the gap 100b, thereby forming the gap 100b on two sides of the first conductive layer 321.

Figure 11:
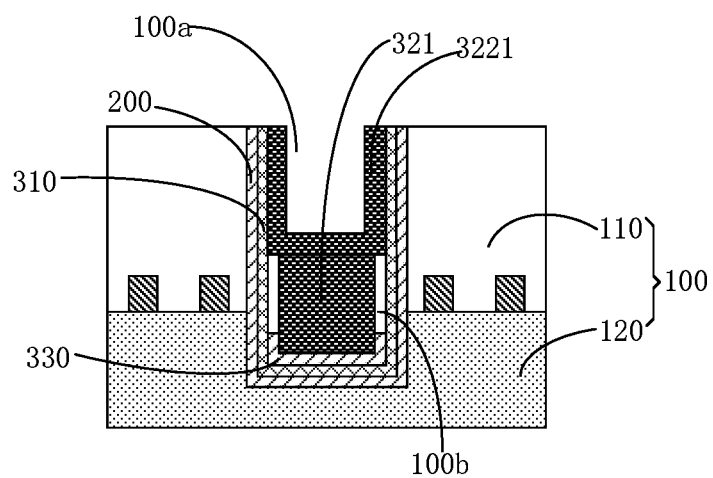
FIG. 11 is a view illustrating a structure obtained by implementing step S900 of the manufacturing method of the semiconductor structure shown in FIG. 1.

Referring to FIG. 11, specifically, the second seed layer 3221 may be formed through PVD, etc. In this embodiment, the second seed layer 3221 facilitates the subsequent formation of a second conductive portion 3222 and closes the gap 100b.

Step S1000: Form the second conductive portion 3222 on a surface of the second seed layer 3221, where the second conductive portion 3222 and the second seed layer 3221 define a second conductive layer 322.

Referring to FIG. 1, specifically, the second conductive portion 3222 may be formed through electroplating, etc. In other embodiments, the first conductive layer 321 and the second conductive layer 322 of the conductive structure 320 may also be formed simultaneously through a single process. The materials of the first conductive layer 321 and the second conductive layer 322 are the same. For example, they are both made of copper (Cu). In this way, the first conductive layer 321 is in good contact with the second conductive layer 322, thereby reducing the contact resistance of the conductive layers and effectively reducing the impedance of the conductive structure 320. Of course, in other embodiments, the materials of the first conductive layer 321 and the second conductive layer 322 may also be different.

Of course, it is understandable that in the present disclosure, the semiconductor structure is not limited to being formed by the manufacturing method in the above embodiments.

In the specification, the description of terms such as "an embodiment" and "an ideal embodiment" means that the specific feature, structure, material or characteristic described in combination with the embodiment or example are included in at least one embodiment or example of the present disclosure. In this specification, the schematic description of the above terms does not necessarily refer to the same embodiment or example.

The technical characteristics of the above examples can be employed in arbitrary combinations. In an effort to provide a concise description of these examples, all possible combinations of all technical characteristics of the examples may not be described; however, these combinations of technical characteristics should be construed as disclosed in the description as long as no contradiction occurs.

Only several implementations of the present disclosure are described in detail above, but they should not therefore be construed as limiting the scope of the present disclosure. It should be noted that those of ordinary skill in the art can further make variations and improvements without departing from the concept of the present disclosure. These variations and improvements all fall within the protection scope of the present disclosure. Therefore, the protection scope of the present disclosure should be subject to the protection scope defined by the claims.

What is claimed is:

1. A semiconductor structure, comprising:
   a base, comprising a substrate and a dielectric layer, wherein the substrate comprises a front surface and a back surface that are opposite to each other; the dielectric layer is formed on the front surface; the base is provided with a via hole; and the via hole penetrates the substrate from the back surface of the substrate and extends to the dielectric layer;
   an insulating layer located on an inner wall surface of the via hole; and
   a conductive structure, wherein the conductive structure comprises a first conductive layer and a second conductive layer connected to each other; the first conductive layer is close to a bottom of the via hole, and the second conductive layer is close to a top of the via hole; and a diameter of the first conductive layer is less than that of the second conductive layer;
   a barrier layer, wherein the barrier layer is located on a surface of the insulating layer; and there is a gap between the barrier layer and the first conductive layer; wherein the first conductive layer and the barrier layer are spaced apart, and the second conductive layer is connected to the barrier layer.

2. The semiconductor structure according to claim 1, further comprising an isolation layer, wherein the isolation layer is located at the bottom of the via hole and between the barrier layer and the first conductive layer; and the barrier layer, the isolation layer, the first conductive layer and the second conductive layer together enclose the gap.

3. The semiconductor structure according to claim 1, wherein the second conductive layer comprises a second conductive portion and a second seed layer surrounding the second conductive portion; and the second seed layer is connected to the barrier layer and the first conductive layer.

4. The semiconductor structure according to claim 1, wherein the first conductive layer and the second conductive layer are made of the same material.

5. The semiconductor structure according to claim 1, wherein a depth-to-width ratio of the via hole is 0.4-50.

6. A stacked structure, formed by processing the semiconductor structure according to claim 1.

7. A stacked structure, formed by processing the semiconductor structure according to claim 2.

8. A stacked structure, formed by processing the semiconductor structure according to claim 3.

9. A stacked structure, formed by processing the semiconductor structure according to claim 4.

10. A stacked structure, formed by processing the semiconductor structure according to claim 5.

11. A manufacturing method of a semiconductor structure, comprising:
   providing a base, wherein the base comprises a substrate and a dielectric layer; the substrate comprises a front surface and a back surface that are opposite to each other; the dielectric layer is formed on the front surface; the base is provided with a via hole; and the via hole penetrates the substrate from the back surface of the substrate and extends to the dielectric layer;
   forming an insulating layer on an inner wall surface of the via hole; and
   forming a conductive structure on a surface of the insulating layer, wherein the conductive structure comprises a first conductive layer and a second conductive layer connected to each other; the first conductive layer is close to a bottom of the via hole, and the second conductive layer is close to a top of the via hole; and a diameter of the first conductive layer is less than that of the second conductive layer;
   wherein after forming the insulating layer on the inner wall surface of the via hole, the method further comprises: forming a barrier layer on the surface of the insulating layer;
   wherein the forming a conductive structure on a surface of the insulating layer comprises:
   forming a primary isolation layer on a surface of the barrier layer, wherein the primary isolation layer comprises a sidewall portion;
   forming a primary conductive layer on a surface of the primary isolation layer;
   removing a part of the primary conductive layer to expose a part of the sidewall portion, such that the remaining primary conductive layer defines a first conductive layer;
   removing a part of the sidewall portion to form a gap between the barrier layer and the first conductive layer, wherein the remaining primary isolation layer defines an isolation layer; and
   forming a second conductive layer on a surface of the barrier layer and a surface of the first conductive layer, wherein the first conductive layer and the second conductive layer define the conductive structure.

12. The method according to claim 11, wherein the via hole is formed by etching from the back surface.

13. The method according to claim 11, wherein the forming a second conductive layer on a surface of the barrier layer and a surface of the first conductive layer comprises:
   forming a second seed layer on the surface of the barrier layer and the surface of the first conductive layer, wherein the second seed layer closes the gap; and
   forming a second conductive portion on a surface of the second seed layer, wherein the second conductive portion and the second seed layer define the second conductive layer.

14. The method according to claim 11, wherein the first conductive layer and the second conductive layer are made of the same material.

* * * * *